United States Patent
Wada et al.

(10) Patent No.: US 6,403,943 B2
(45) Date of Patent: Jun. 11, 2002

(54) VARIABLE RESISTANCE CIRCUIT, OPERATIONAL AMPLIFICATION CIRCUIT, SEMICONDUCTOR INTEGRATED CIRCUIT, TIME CONSTANT SWITCHING CIRCUIT AND WAVEFORM SHAPING CIRCUIT

(75) Inventors: Atsushi Wada, Ogaki; Takeshi Otsuka, Gifu-ken; Kuniyuki Tani, Ogaki, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/795,443

(22) Filed: Mar. 1, 2001

(30) Foreign Application Priority Data

Mar. 2, 2000 (JP) .......................... 2000-056771
Mar. 24, 2000 (JP) .......................... 2000-084804
Mar. 28, 2000 (JP) .......................... 2000-089806

(51) Int. Cl.$^7$ .............................. H01J 40/14
(52) U.S. Cl. .................. 250/214 A; 250/214 R; 250/214 LS
(58) Field of Search .................. 250/214 A, 214 LS, 250/214 LA, 214 SW, 214 R; 330/308, 59; 200/61.02; 327/514, 520, 521

(56) References Cited

U.S. PATENT DOCUMENTS 5,029,203 A * 7/1991 Ikefuji et al. ............... 379/391

* cited by examiner

Primary Examiner—Que T. Le
(74) Attorney, Agent, or Firm—Armstrong, Westerman & Hattori, LLP

(57) ABSTRACT

Eight resistors having resistance values of $R \times 2^i$ (i=0 to 7) ($\Omega$) are serially connected while eight switches exhibiting parasitic resistance values of $r \times 2^i$ ($\Omega$) in ON states are connected in parallel with the resistors respectively, for changing a resistance value by turning on/off the switches. The resistors are connected between an inversion input terminal of an operational amplifier and a terminal, and a non-inversion input terminal receives a prescribed reference voltage. Between the inversion input terminal and an output terminal of the operational amplifier, a resistor and a switch of a variable resistance circuit forming a negative feedback loop are connected to the output terminal while another resistor and another switch are connected to the inversion input terminal. In the variable resistance circuit, the resistance values of the resistors are successively increased from the side of the terminal, so that the resistor connected to the inversion input terminal has the maximum resistance value. Thus, only a single node is present ahead of the last resistor while a parasitic capacitance is minimized, whereby the frequency characteristic of an operational amplification circuit can be improved.

15 Claims, 14 Drawing Sheets

F I G. 2
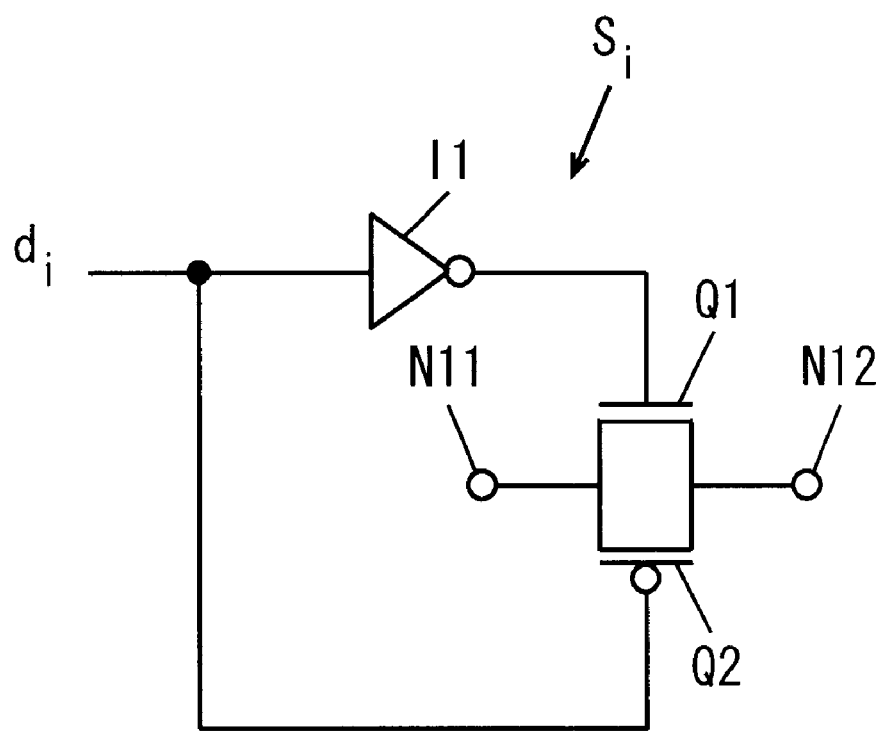

F I G. 1 6 PRIOR ART

VARIABLE RESISTANCE CIRCUIT, OPERATIONAL AMPLIFICATION CIRCUIT, SEMICONDUCTOR INTEGRATED CIRCUIT, TIME CONSTANT SWITCHING CIRCUIT AND WAVEFORM SHAPING CIRCUIT

BACKGROUND OF THE INVENTION

1. Field of the Invention

The present invention relates to a variable resistance circuit varying the resistance value thereof by turning on/off a plurality of switches connected in parallel with a plurality of serially connected resistors respectively, an operational amplification circuit employing this variable resistance circuit, a semiconductor integrated circuit employing this operational amplification circuit, a time constant switching circuit, and a waveform shaping circuit, having a small number of time constant errors, using this time constant switching circuit.

2. Description of the Prior Art

In recent years, optical disk drives such as a CD (compact disk) drive, a CD-ROM (compact disk read only memory) drive and the like come into wide use, followed by development of various semiconductor integrated circuits applied to these optical disk drives.

FIG. 14 is a block diagram showing the structure of a conventional semiconductor integrated circuit applied to a CD-ROM drive.

The circuit shown in FIG. 14, formed by a plurality of semiconductor integrated circuits, comprises a signal processing circuit 200, an RF (radio frequency) amplifier 220, a drive circuit 230, a microcomputer 240 and a DRAM (dynamic random access memory) 250.

The signal processing circuit 200 includes a DSP (digital signal processor) 201, aDAC (digital-to-analog converter) 202, a servo circuit 203 and an error correction circuit 204. The RF amplifier 220 is formed by a bipolar integrated circuit with different components, and the signal processing circuit 200 is integrated into a single chip by a CMOS (complementary metal oxide semiconductor) integrated circuit.

An optical pickup 210 converts data recorded on a CD-ROM disk to an RF signal, and outputs the RF signal to the RF amplifier 220. The RF amplifier 220 generates a reproduced signal (EFM (eight to fourteen modulation) signal), a focus error signal and a tracking error signal etc., and outputs these signals to the signal processing circuit 200.

The signal processing circuit 200 creates a control signal for controlling the optical pickup 210 from the focus error signal, the tracking error signal etc. through the DSP 201 and the servo circuit 203, and outputs the control signal to the drive circuit 230. The drive circuit 230 drives an actuator provided in the optical pickup 210 in response to the input control signal, for controlling the optical pickup 210 to reproduce an excellent RF signal.

The signal processing circuit 200 further performs error correction of the reproduced data by the error correction circuit 204 with the DRAM 250, for converting the reproduced data to an analog signal by the DAC 202 and outputting the analog signal when reproducing a sound signal.

The microcomputer 240 serves as a system controller controlling operations of the overall drive and transmits/receives data etc. to/from the signal processing circuit 200 at need so that the CD-ROM drive executes various operations.

The RF amplifier 220 of the CD-ROM drive having the aforementioned structure internally varies the amplification factor for the RF signal with various levels of RF signals for reproducing data from various optical disks such as a CD, a CD-ROM, a CD-RW (compact disk rewritable) and the like. Therefore, the RF amplifier 220 comprises a PGA (programmable gain amplifier) or the like varying the amplification factor for the RF signal, and employs a variable resistance circuit settable to various resistance values for gain control.

FIG. 15 is a circuit diagram showing the structure of a conventional variable resistance circuit. The variable resistance circuit shown in FIG. 15 includes a decoding circuit 300, switches SW0 to SW255 and resistors TR0 to TR255.

The 256 resistors TR0 to TR255 are serially connected with each other, the resistance values of all resistors TR0 to TR255 are set to R ($\Omega$), and the resistors TR0 to TR255 are identical to each other. The switches SW0 to SW255, connected in parallel with the corresponding ones of the resistors TR0 to TR255 respectively, are identical to each other. When the switches SW0 to SW255 are turned on, the resistors TR0 to TR255 connected therewith are so bypassed as to change the resistance value of the variable resistance circuit.

Control signals d1 to d8 of eight bits are input in the decoding circuit 300. The control signal d1 expresses the least significant bit, the control signal d8 expresses the most significant bit, and the respective values of 0 to 255 can be expressed by the control signals d1 to d8. The decoding circuit 300 decodes the control signals d1 to d8 of eight bits and outputs control signals for turning on/off the switches SW0 to SW255 and setting resistance values corresponding to data expressed by the control signals d1 to d8 of eight bits to the switches SW0 to SW255.

The switches SW0 to SW255 are turned on/off by the control signals output from the decoding circuit 300 respectively, and the ON-state switches bypass the resistors. Therefore, the resistance value of the variable resistance circuit is set to an arbitrary value among 0 ($\Omega$), R ($\Omega$), 2R ($\Omega$), ..., 255R ($\Omega$) by bypassing an arbitrary resistor among the 256 resistors TR0 to TR255 in response to the control signals d1 to d8 of eight bits.

FIG. 16 is a circuit diagram showing the structure of another conventional variable resistance circuit. The variable resistance circuit shown in FIG. 16 includes switches SW10 to SW17 and resistors TR10 to TR17. The eight resistors TR10 to TR17 are serially connected with each other. The resistors TR10, TR11 and TR12 have resistance values R ($\Omega$), 2R ($\Omega$) and 4R ($\Omega$) respectively, and the resistance values of the subsequent resistors TR13 to TR17 are successively doubled so that the resistance value of the final resistor TR17 is set to 128 R ($\Omega$).

The switches SW10 to SW17 are connected in parallel with the corresponding ones of the resistors TR10 to TR17 respectively, and turned on/off thereby bypassing the resistors TR10 to TR17 connected therewith.

The aforementioned control signals d1 to d8 of eight bits are input in the switches SW10 to SW17 respectively, for setting the resistance value of the variable resistance circuit to an arbitrary value among 0 ($\Omega$), 2R ($\Omega$), ..., 255R ($\Omega$).

As hereinabove described, the variable resistance circuit shown in FIG. 15 requires the 256 resistors TR0 to TR255 and the 256 switches SW0 to SW255 as well as the decoding circuit 300 decoding the control signals d1 to d8 of eight bits, in order to implement resolution of eight bits. Therefore, the circuit area of the variable resistance circuit is remarkably increased. When such a variable resistance circuit having a large circuit area is integrated with other circuits, the area of the integrated circuit is disadvantageously increased.

Further, linearity of the resistance value of the variable resistance circuit shown in FIG. 16 is deteriorated due to parasitic resistances of the switches SW10 to SW17. Assuming that the parasitic resistance value of each of the switches SW10 to SW17 is r ($\Omega$), the resistance value of the variable resistance circuit is 255R ($\Omega$) when all switches SW0 to SW17 are off, 254R+r×R/(r+R) ($\Omega$) when the switch SW10 is on and the switches SW11 to SW17 are off, 253R+2r×R/(r+2R) ($\Omega$) when the switch SW11 is on and the switches SW10 and SW12 to SW17 are off, or 252R+r×R/(r+R)+2r×R/(r+2R) ($\Omega$) when the switches SW10 and SW11 are on and the switches SW12 to SW17 are off.

Thus, the change rate of the resistance value of the variable resistance circuit is R−r×R/(r+R) ($\Omega$), R+r×R/(r+R)−2r×R/(r+2R) ($\Omega$) or R−r×R/(r+R) ($\Omega$). In other words, even if the change rate of the resistance value by the resistors TR10 to TR17 is constant, the change rate of the resistance value by the parasitic resistances of the switches SW10 to SW17 is not constant. Therefore, the change rate is not constant but the linearity of the resistance value of the variable resistance circuit is deteriorated due to the parasitic resistances of the switches SW10 to SW17.

In order to ensure the linearity of the resistance value of the variable resistance circuit, the switches SW10 to SW17 must be sufficiently increased in size so that the parasitic resistances thereof hardly influence the resistance value of the variable resistance circuit. Thus, the circuit area of the variable resistance circuit is disadvantageously increased. When such a variable resistance circuit having a large circuit area is integrated with other circuits, the area of the integrated circuit is increased.

As hereinabove described, it is difficult to reduce the area of the conventional variable resistance circuit or to improve the precision of the resistance value although the area can be reduced. Thus, area reduction and improvement in precision cannot be compatibly attained in the conventional variable resistance circuit.

FIG. 17 shows a conventional time constant switching circuit used as a filter for example. Referring to FIG. 17, eight capacitors are switched for varying a time constant. First and second terminals of a resistor 1 form input and output terminals 2 and 3 respectively. A plurality of switches 4a to 4h are connected in parallel with the output terminal 3, and grounded capacitors 5a to 5h having different capacitance values are connected to second terminals of the switches 4a to 4h respectively with relation of C(5a)<C(5c) . . . <C(5h) between the capacitance values. Control signals 6a to 6h on-off control the switches 4a to 4h respectively.

In the circuit shown in FIG. 17, the time constant is decided by the product of the resistance value of the resistor and the sum of the capacitance values connected to the output terminal 3. Thus, it is possible to change the capacitance values connected to the output terminal 3 and vary the time constant by controlling the switches 4a to 4h.

When selecting the capacitor 5a having the minimum capacitance value, for example, only the control signal 6a turns on only the switch 4a as an "ON" level. At this time, the control signals 6b to 6h for the remaining switches 4b to 4h are brought into OFF states. Therefore, only the capacitor 5a is connected to the output terminal 3 for implementing the time constant decided by the product of the resistance value of the resistor 1 and the capacitance value of the capacitor 5a. When connecting a plurality of capacitors such as the capacitors 5a and 5b, for example, the switches 4a and 4b are turned on and the remaining switches 4c to 4h are turned off.

In the aforementioned structure, however, the time constant is influenced by parasitic capacitances of the switches 4a to 4h. FIG. 18 shows a switch formed by an N-channel transistor 7. Referring to FIG. 18, source and drain terminals of the N-channel transistor 7 form input and output terminals 8 and 9 of the switch respectively. Further, a gate terminal of the transistor 7 forms a control terminal 10 of the switch. When forming the switch by the N-channel transistor 7 in the aforementioned manner, diffusion capacitances 11 and 12 are present on the input and output terminals 8 and 9 of the switch as parasitic capacitances respectively. When the switch is on, further, gate capacitances 13 and 14 are present as parasitic capacitances in addition to the aforementioned diffusion capacitances 11 and 12.

Therefore, when connecting only the capacitor 5a in FIG. 17, for example, parasitic capacitances (diffusion capacitances) of the OFF-state switches 4b and 4h are also added to the output terminal 3 in addition to the parasitic capacitance of the ON-state switch 4a, and hence the time constant is disadvantageously increased to deteriorate a filter characteristic. There is a tendency that such influence is remarkable particularly when using a small capacitor, i.e., when the time constant is small.

SUMMARY OF THE INVENTION

An object of the present invention is to provide a variable resistance circuit capable of reducing the circuit area and setting the resistance value in high precision, an operational amplification circuit employing this variable resistance circuit and a semiconductor integrated circuit employing this operational amplification circuit.

Another object of the present invention is to provide an operational amplification circuit capable of reducing the circuit area and having an excellent frequency characteristic and a semiconductor integrated circuit employing this operational amplification circuit.

Still another object of the present invention is to provide a filter time constant switching circuit suppressing deterioration of a filter characteristic resulting from a parasitic capacitance in a switch part for varying a capacitance value deciding the time constant of a filter.

A variable resistance circuit according to an aspect of the present invention comprises serially connected N (N: integer of at least 2) resistors and N switches connected in parallel with the N resistors respectively and selectively turned on or off, while the resistance value of at least one of the resistors is different from the resistance value of another resistor and the resistance value of a parasitic resistance of each of the N switches in an ON state is in proportion to or in positive correlation similar to proportion to the resistance value of the resistor connected in parallel with this switch.

In the variable resistance circuit, the N resistors are serially connected with each other, and the switches are connected in parallel with the N resistors respectively and turned on so that the resistors connected with the ON-state switches are bypassed to change the resistance value. At least one of the N resistors has a different resistance value, and hence various resistance values can be set in excess of the number of the resistors by varying combination of the bypassed resistors and a number of resistance values can be set with a small circuit area. Further, the parasitic resistance value of the ON-state switch is in proportion to or in positive correlation similar to proportion to the resistance value of the resistor connected in parallel with this switch, whereby the combined resistance value of the parasitic resistance of the switch and the resistor is in proportion to the resistance value of the resistor and linearity of the resistance value of the variable resistance circuit can be ensured. Consequently, the circuit area of the variable resistance circuit can be reduced while the resistance value can be set in high precision.

Each of the N switches may include a transistor connected in parallel with each resistor, and the resistance value of the resister may be in inverse proportion to or in negative correlation similar to inverse proportion to the gate width of the transistor connected in parallel with this resister.

In this case, the resistance value of the resister is in inverse proportion to or in negative correlation similar to inverse proportion to the gate width of the transistor so that the resistance value of a parasitic resistance of the transistor can be in proportion to the resistance value of the resistor, whereby the parasitic resistance can be controlled by simply changing the gate width and the variable resistance circuit can be readily manufactured.

Each resistance value of the N resistors may be set to $R \times 2^i$ ($\Omega$) (i: integer of 0 to (N−1)), and the resistance value of each parasitic resistance of the N switches may be set to $r \times 2^i$ ($\Omega$).

In this case, $2^N$ resistance values can be set with the N resistors, whereby the circuit area of the variable resistance circuit can be extremely reduced while the resistance value can be set to an arbitrary level among the $2^N$ resistance values by control signals of N bits so that the variable resistance circuit can be readily controlled.

The switches maybe formed by CMOS switches. In this case, a circuit including the variable resistance circuit can be formed by a CMOS integrated circuit.

An operational amplification circuit according to another aspect of the present invention comprises a variable resistance circuit and an operational amplifier, connected with the variable resistance circuit, having an amplification factor varying with the resistance value of the variable resistance circuit, while the variable resistance circuit includes serially connected N (N: integer of at least 2) resistors and N switches connected in parallel with the N resistors respectively and selectively turned on or off, the resistance value of at least one of the resistors is different from the resistance value of another resistor, and the resistance value of a parasitic resistance of each of the N switches in an ON state is in proportion to or in positive correlation similar to proportion to the resistance value of the resistor connected in parallel with this switch.

In the operational amplification circuit, the aforementioned variable resistance circuit is connected with the operational amplifier for varying the amplification factor with the resistance value of the variable resistance circuit capable of varying the resistance value in high precision, whereby the amplification factor can be set in high precision while the circuit area of the operational amplification circuit can be reduced due to the small circuit area of the variable resistance circuit.

The variable resistance circuit may be connected to an input terminal of the operational amplifier, and the resistor having the maximum resistance value may be connected to the input terminal among the N resistors.

In this case, the switches form parasitic capacitances on nodes connecting the resistors and the variable resistance circuit is influenced by a CR time constant by the parasitic capacitances and the resistors, while the resistor connected to the input terminal has the maximum resistance value and hence the parasitic capacitance acting on the resistor having the maximum resistance value is so minimized that the CR time constant of the variable resistance circuit itself can be totally reduced and an operational amplification circuit having an excellent frequency characteristic can be implemented.

A semiconductor integrated circuit according to still another aspect of the present invention, receiving an output signal from an optical pickup, comprises an operational amplification circuit amplifying the output signal from the optical pickup and another circuit, while the operational amplification circuit and the other circuit are integrated into a single chip by a CMOS integrated circuit, the operational amplification circuit includes a variable resistance circuit and an operational amplifier, connected with the variable resistance circuit, having an amplification factor varying with the resistance value of the variable resistance circuit, the variable resistance circuit includes serially connected N (N: integer of at least 2) resistors and N switches connected in parallel with the N resistors respectively and selectively turned on or off, the resistance value of at least one of the resistors is different from the resistance value of another resistor, and the resistance value of a parasitic resistance of each of the N switches in an ON state is in proportion to or in positive correlation similar to proportion to the resistance value of the resistor connected in parallel with this switch.

The semiconductor integrated circuit employs the aforementioned operational amplification circuit capable of setting the amplification factor in high precision and reducing the circuit area for the amplification circuit amplifying the output signal from the optical pickup and integrates the amplification circuit and the other circuit into a single chip by the CMOS integrated circuit, whereby a one-chip CMOS integrated circuit for an optical disk drive including a high-precision amplification circuit having a reduced area can be implemented.

An operational amplification circuit according to a further aspect of the present invention comprises an operational amplifier and a variable resistance circuit connected to an input terminal of the operational amplifier, while the variable resistance circuit includes serially connected N (N: integer of at least 2) resistors and N switches connected in parallel with the N resistors respectively and selectively turned on or off, the resistance value of at least one of the resistors is different from the resistance value of another resistor, and the resistor having the maximum resistance value is connected to the input terminal among the N resistors.

The N resistors are serially connected with each other, and the switches are connected in parallel with the N resistors respectively and turned on so that the resistors connected with the ON-state switches are bypassed to change the resistance value. At least one of the N resistors has a different resistance value, and hence various resistance values can be set in excess of the number of the resistors by varying combination of the bypassed resistors and a number of resistance values can be set with a small circuit area.

The switches form parasitic capacitances on nodes connecting the resistors and the variable resistance circuit is influenced by a CR time constant by the parasitic capacitances and the resistors, while the resistor connected to the input terminal has the maximum resistance value and hence the parasitic capacitance acting on the resistor having the maximum resistance value is so minimized that the CR time constant of the variable resistance circuit itself can be totally reduced and an operational amplification circuit having an excellent frequency characteristic can be implemented.

In this case, the N resistors are preferably arranged in order of the resistance values. Thus, the influence by the CR time constant resulting from the parasitic capacitances of the switches and the resistors can be reduced for preventing deterioration of the frequency characteristic.

Each resistance value of the N resistors is preferably set to $R \times 2^i$ (Ω) (i: integer of 0 to (N−1)).

Thus, $2^N$ resistance values can be set with the N resistors, whereby the circuit area of the variable resistance circuit can be extremely reduced while the resistance value can be set to an arbitrary level among the $2^N$ resistance values by control signals of N bits so that the variable resistance circuit can be readily controlled.

The variable resistance circuit preferably includes a fixed resistor arranged between the resistor having the maximum resistance value and the input terminal.

The switches are preferably formed by CMOS switches.

The variable resistance circuit is preferably used as a resistance circuit forming a feedback loop of the operational amplifier, and the amplification factor of the operational amplifier preferably varies with the resistance value of the variable resistance circuit.

Thus, the amplification factor is varied with the resistance value of the variable resistance circuit having an excellent frequency characteristic, whereby the amplification factor can be set in high precision while the circuit area of the operational amplification circuit can be reduced due to the small circuit area of the variable resistance circuit.

The operational amplification circuit may further comprise a resistance circuit, forming a feedback loop of the operational amplifier, including a fixed resistor, an input signal may be input in the operational amplifier through the variable resistance circuit, and the operational amplifier, the variable resistance circuit and the resistance circuit may constitute a programmable gain amplifier.

Thus, the switches exert no bad influence on the characteristics in the feedback loop, and a boost can be suppressed at a high frequency.

A semiconductor integrated circuit according to a further aspect of the present invention, receiving an output signal from an optical pickup, comprises an operational amplification circuit amplifying the output signal from the optical pickup and another circuit, while the operational amplification circuit and the other circuit are integrated into a single chip by a CMOS integrated circuit, the operational amplification circuit includes an operational amplifier and a variable resistance circuit connected to an input terminal of the operational amplifier, the variable resistance circuit includes serially connected N (N: integer of at least 2) resistors and N switches connected in parallel with the N resistors respectively and selectively turned on or off, the resistance value of at least one of the resistors is different from the resistance value of another resistor, and the resistor having the maximum resistance value is arranged on the side of the input terminal among the N resistors.

Thus, the frequency characteristic of the amplification circuit amplifying the output signal from the optical pickup is improved and the circuit area can be reduced, while a one-chip CMOS integrated circuit for an optical disk drive including the amplification circuit having an excellent frequency characteristic and a reduced area can be implemented.

A time constant switching circuit according to a further aspect of the present invention comprises a resistor having a first terminal forming an input terminal and a second terminal forming an output terminal, a plurality of time constant switching capacitors for varying a capacitance value connected to the output terminal, a first switch controlled by a time constant control signal for changing the capacitance value connected to the output terminal and a second switch, while the plurality of time constant switching capacitors are divided into a plurality of groups, a group including the capacitor having the minimum capacitance value is directly connected to the output terminal, and another group is connected to the output terminal through the second switch.

Thus, when implementing a smaller time constant, the number of switches connected to the output terminal can be reduced and the parasitic capacitances of the switches can be reduced for suppressing characteristic deterioration resulting from the parasitic capacitances.

The group including the capacitor having the minimum capacitance value may be formed by a single capacitor. Thus, only a single OFF-state switch is connected to the output terminal when implementing the minimum time constant, whereby characteristic deterioration caused by a parasitic capacitance can be suppressed.

The plurality of groups of the capacitors may be connected successively from the group including the capacitor having the minimum capacitance value. Thus, the parasitic capacitances of the switches can be reduced as the implemented time constant is reduced, whereby characteristic deterioration caused by a parasitic capacitance can be suppressed.

A waveform shaping circuit according to a further aspect of the present invention comprises a resistor having a first terminal receiving an input and a second terminal, a differential amplifier having an inversion input terminal connected to the second terminal of the resistor, resistors serially connected between the inversion input terminal and an output terminal of the differential amplifier and a time constant switching circuit connected to a node of the resistors serially connected, while the time constant switching circuit includes a resistor having a first terminal forming an input terminal and a second terminal forming an output terminal, a plurality of time constant switching capacitors for varying a capacitance value connected to the output terminal, a first switch controlled by a time constant control signal for changing the capacitance value connected to the output terminal and a second switch, the plurality of time constant switching capacitors are divided into a plurality of groups, a group including the capacitor having the minimum capacitance value is directly connected to the output terminal, and another group is connected to the output terminal through the second switch. Thus, a waveform shaping circuit having small characteristic deterioration caused by a parasitic capacitance can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram showing an exemplary switch shown in FIG. 1;

DESCRIPTION OF THE PREFERRED EMBODIMENTS (First Embodiment)

A first embodiment of the present invention is described with reference to FIGS. 1 to 6.

Figure 1:
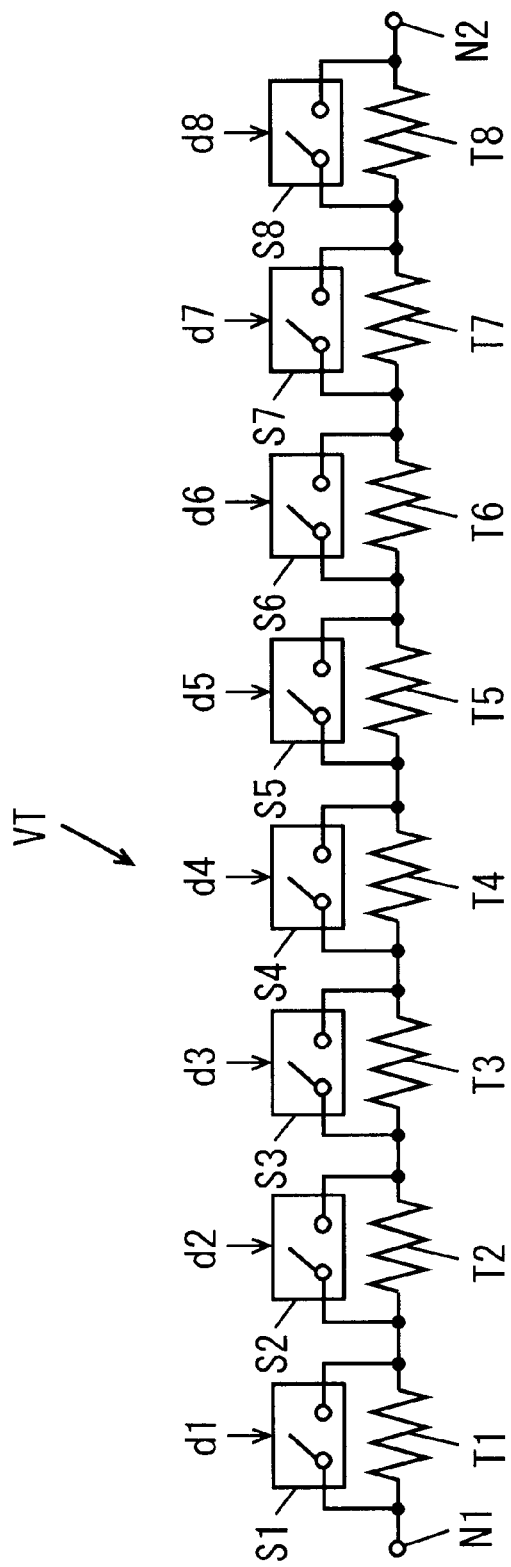
FIG. 1 is a circuit diagram showing the structure of a variable resistance circuit according to a first embodiment of the present invention.

FIG. 1 is a circuit diagram showing the structure of a variable resistance circuit VT according to the first embodiment of the present invention.

Referring to FIG. 1, the variable resistance circuit VT includes resistors T1 to T8 and switches S1 to S8. The resistor T1 is connected between a terminal N1 and the resistor T2, and the switch S1 is connected in parallel with the resistor T1. Similarly, the resistors T2 to T8 and the switches S2 to S8 connected in parallel with each other are serially connected. Control signals d1 to d8 of eight bits are input in the switches S1 to S8 respectively so that the switches S1 to S8 are turned on/off in response to the control signals d1 to d8.

The resistors T1 and T2 have resistance values R ($\Omega$) and 2R ($\Omega$) respectively, and the resistance values of the subsequent resistors T3 to T8 are successively doubled. In other words, each resistance value of the resistors T1 to T8 is set to $R \times 2^i$ (i=0 to 7) ($\Omega$). The resistance value of each parasitic resistance of the switches S1 to S8 in an ON state is set to $r \times 2^i$ (i=0 to 7) ($\Omega$). Therefore, the resistance values of the resistors T1 to T8 and the resistance values of the parasitic resistances of the switches S1 to S8 connected in parallel with the resistors T1 to T8 are in proportion to each other.

Among the control signals d1 to d8 corresponding to data of eight bits, the control signal d1 corresponds to the least significant bit, and the control signal d8 corresponds to the most significant bit. Thus, values 0 to 255 can be expressed by the control signals d1 to d8. The switches S1 to S8 are turned off when the control signals d1 to d8 are 1, while the former are turned on when the latter are zero for bypassing the resistors connected with the ON-state switches.

When 1, 1, 1, 1, 1, 1, 1 and 1 are input in the switches S1 to S8 as the control signals d1 to d8 respectively, for example, all switches S1 to S8 are turned off and the resistance values of the resistors T1 to T8 are added up so that the resistance value of the variable resistance circuit VT is 255R ($\Omega$).

When 0, 1, 1, 1, 1, 1, 1 and 1 are input as the control signals d1 to d8 respectively, the switch S1 is turned on and the switches S2 to S8 are turned off. At this time, the resistors T2 to T8 are serially connected and the resistance value of this part reaches 254R ($\Omega$), the combined resistance value of the switch SI and the resistor T1 is $r \times R/(r+R)$ ($\Omega$), and the resistance value of the variable resistance circuit VT is $254R + r \times R/(r+R)$ ($\Omega$).

When 1, 0, 1, 1, 1, 1, 1 and 1 are input as the control signals d1 to d8 respectively, the resistance value of the variable resistance circuit VT is $253R + 2r \times R/(r+R)$ ($\Omega$). The resistance value of the variable resistance circuit VT thereafter similarly varies with the control signals d1 to d8, to reach $R + 254r \times R/(r+R)$ ($\Omega$) when 1, 0, 0, 0, 0, 0, 0 and 0 are input or reach $R + 255r \times R/(r+R)$ ($\Omega$) when 0, 0, 0, 0, 0, 0, 0 and 0 are input.

As hereinabove described, the resistance value of the variable resistance circuit VT varies by $R - r \times R/(r+R)$ ($\Omega$) with the control signals d1 to d8. Thus, the resistance value of the variable resistance circuit VT varies by the constant rate $R - r \times R/(r+R)$ ($\Omega$), and can ensure linearity. $2^N$ resistance values can be set with the eight resistors T1 to T8 so that the circuit area of the variable resistance circuit VT can be extremely reduced, while an arbitrary resistance value can be selected from the $2^N$ resistance values in response to the control signals d1 to d8 of eight bits so that the resistance value of the variable resistance circuit VT can be readily controlled.

While eight resistors T1 to T8 and eight switches S1 to S8 are employed in the above description, the numbers of the serially connected resistors and switches are not particularly restricted to the above but other numbers of resistors and switches may be employed in response to the resistance value to be varied etc. Further, the resistance values of the resistors T1 to T8 are not particularly restricted to the above either but various resistance values can be employed in response to the resistance value to be varied etc. while the arrangement of the resistance values is not particularly restricted to the aforementioned arrangement successively increased from the terminal N1 toward the terminal N2 but the resistors T1 to T8 may be arranged on different positions. In addition, the resistance values of the parasitic resistances may not be completely in proportion to the resistance values of the resistors T1 to T8 but may be in positive correlation similar to proportion to the resistance values of the resistors T1 to T8.

FIG. 2 is a circuit diagram showing an exemplary switch S1 forming each of the switches S1 to S8 shown in FIG. 1. The switch Si shown in FIG. 2 includes an N-channel MOS field-effect transistor (hereinafter referred to as an NMOS transistor) Q1, a p-channel MOS field-effect transistor (hereinafter referred to as a PMOS transistor) Q2 and an inverter I1.

The NMOS transistor Q1 and the PMOS transistor Q2 are connected between the terminals N11 and N12, so that the control signal di (i=1 to 8) is input in the gate of the NMOS transistor Q1 through the inverter I1 and also input in the gate of the PMOS transistor Q2 for forming a CMOS switch. Therefore, the NMOS transistor Q1 and the PMOS transistor Q2 are turned off when 1 is input as the control signal di, and turned on when 0 is input.

When employing CMOS switches each having the aforementioned structure for the switches S1 to S8 shown in FIG. 1, the gate lengths of the NMOS transistors Q1 and the PMOS transistors Q2 are set constant, gate widths W are varied and the resistance values of the parasitic resistances of the switches S1 to s8 are set as described above.

Assuming that W represents the gate width W of the NMOS transistor Q1 and the PMOS transistor Q2 of the switch S1, the gate width of the NMOS transistor Q1 and the PMOS transistor Q2 of the switch S2 is set to W/2, the gate width of the NMOS transistor Q1 and the PMOS transistor Q2 of the switch S3 is set to W/4, and the gate widths of the remaining switches S4 to S8 are successively halved. The resistance values of the parasitic resistances of the CMOS switches can be set to $r \times 2^i$ (i=0 to 7) ($\Omega$) by varying the gate widths in the aforementioned manner.

When forming the switches S1 to S8 by transistors as described above, the linearity of the variable resistance circuit VT is independent of the resistance values of the parasitic resistances and hence the transistor sizes may not be particularly increased but the circuit area of the variable resistance circuit VT can be reduced.

The switches S1 to S8 are not particularly restricted to the aforementioned CMOS switches but may be formed by other switches so far as the resistance values of the parasitic resistances in ON states can be set in response to the resistance values of the resistors T1 to T8 connected therewith. Further, the gate widths of the transistors may not be completely in inverse proportion to the resistance values of the resistors T1 to T8 but may be in negative correlation similar to inverse proportion to the resistance values of the resistors T1 to T8.

Figure 3:
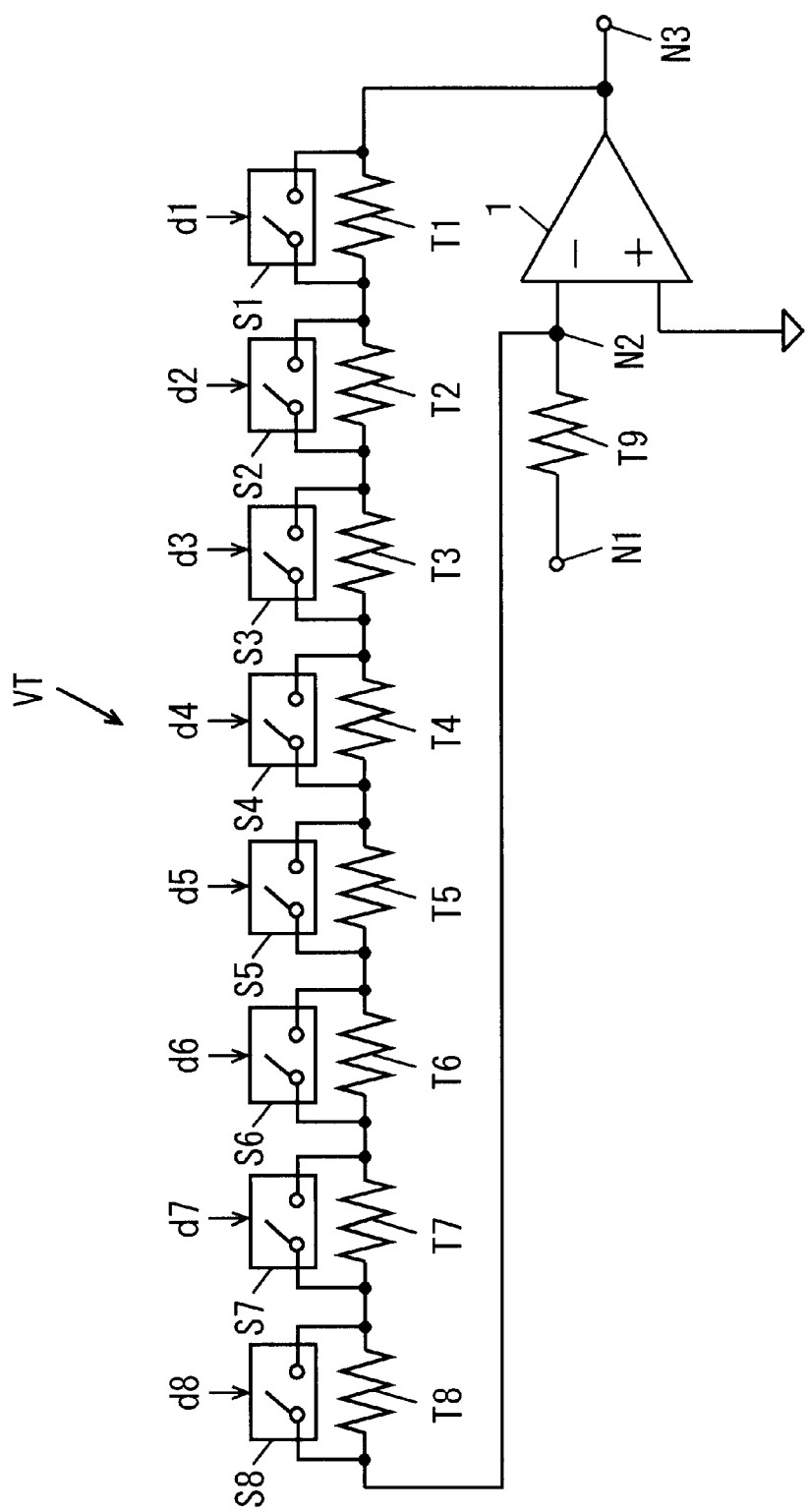
FIG. 3 illustrates an exemplary operational amplification circuit employing the variable resistance circuit shown in FIG. 1.

FIG. 3 illustrates an exemplary operational amplification circuit employing the variable resistance circuit VT shown in FIG. 1. The operational amplification circuit shown in FIG. 3 includes the variable resistance circuit VT, an operational amplifier 1 and a resistor T9.

Referring to FIG. 3, the resistor T9 is connected between an inversion input terminal of the operational amplifier 1 and a terminal N1, while a non-inversion input terminal receives a prescribed reference voltage. The variable resistance circuit VT shown in FIG. 1, forming a negative feedback loop, is connected between the inversion input terminal and an output terminal of the operational amplifier 1, so that the resistor T1 and the switch S1 are connected to the output terminal and the resistor T8 and the switch S8 are connected to the inversion input terminal.

Assuming that VR represents the resistance value of the variable resistance circuit VT and Rf represents the resistance value of the resistor T9, a signal input in the terminal N1 is amplified with an amplification factor of VR/Rf and output from a terminal N3 in the operational amplification circuit shown in FIG. 3, due to the aforementioned structure. At this time, the variable resistance circuit VT can vary the resistance value VR in 256 stages in response to the control signals dl to d8 with excellent linearity, whereby the signal input from the terminal N1 can be amplified in high precision and output from the terminal N3.

The resistance values of the resistors T1 to T8 are successively increased from the side of the terminal N3, so that the resistor T8 connected to the inversion input terminal has the maximum resistance value. The switches S1 to s8 form parasitic capacitances on nodes connecting the resistors T1 to T8, and a CR time constant is increased when the resistors T1 to T8 have large resistance values, to deteriorate the frequency characteristic of the operational amplification circuit.

In the operational amplification circuit shown in FIG. 3, however, the resistors T1 to T8 are arranged in the aforementioned manner so that a signal fed back from the output terminal of the operational amplifier 1 is transmitted successively from the resistor 1 having the minimum resistance value. While the parasitic capacitance of the first resistor T1 having a plurality of nodes ahead thereof is maximized, that of the final resistor T8 having only a single node ahead thereof is minimized. Thus, the parasitic capacitance acting on the resistor T8 having the maximum resistance value can be minimized for totally reducing the CR time constant of the variable resistance circuit VT itself and improving the frequency characteristic of the operational amplification circuit.

Figure 4:
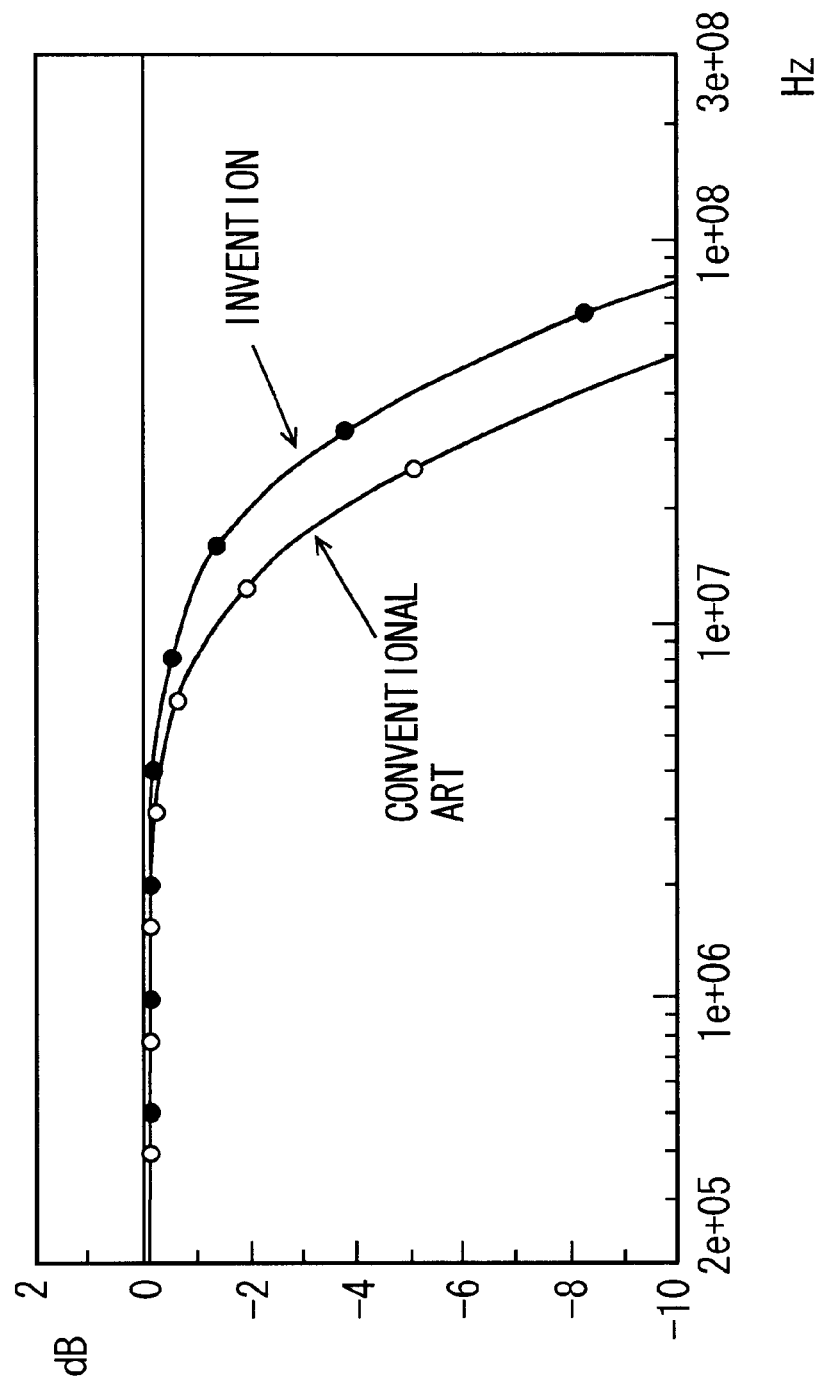
FIG. 4 illustrates a result of measurement of the frequency characteristic of the variable resistance circuit according to the present invention.

FIG. 4 shows results of measurement of frequency characteristics with reference to a conventional variable resistance circuit provided with a final resistor, connected to an inversion input terminal of an operational amplifier, having the minimum resistance value and the inventive variable resistance circuit VT provided with the final resistor T8 having the maximum resistance value. As clearly understood from FIG. 4, the characteristic in a high-frequency region is inhibited from deterioration according to the present invention.

Figure 5:
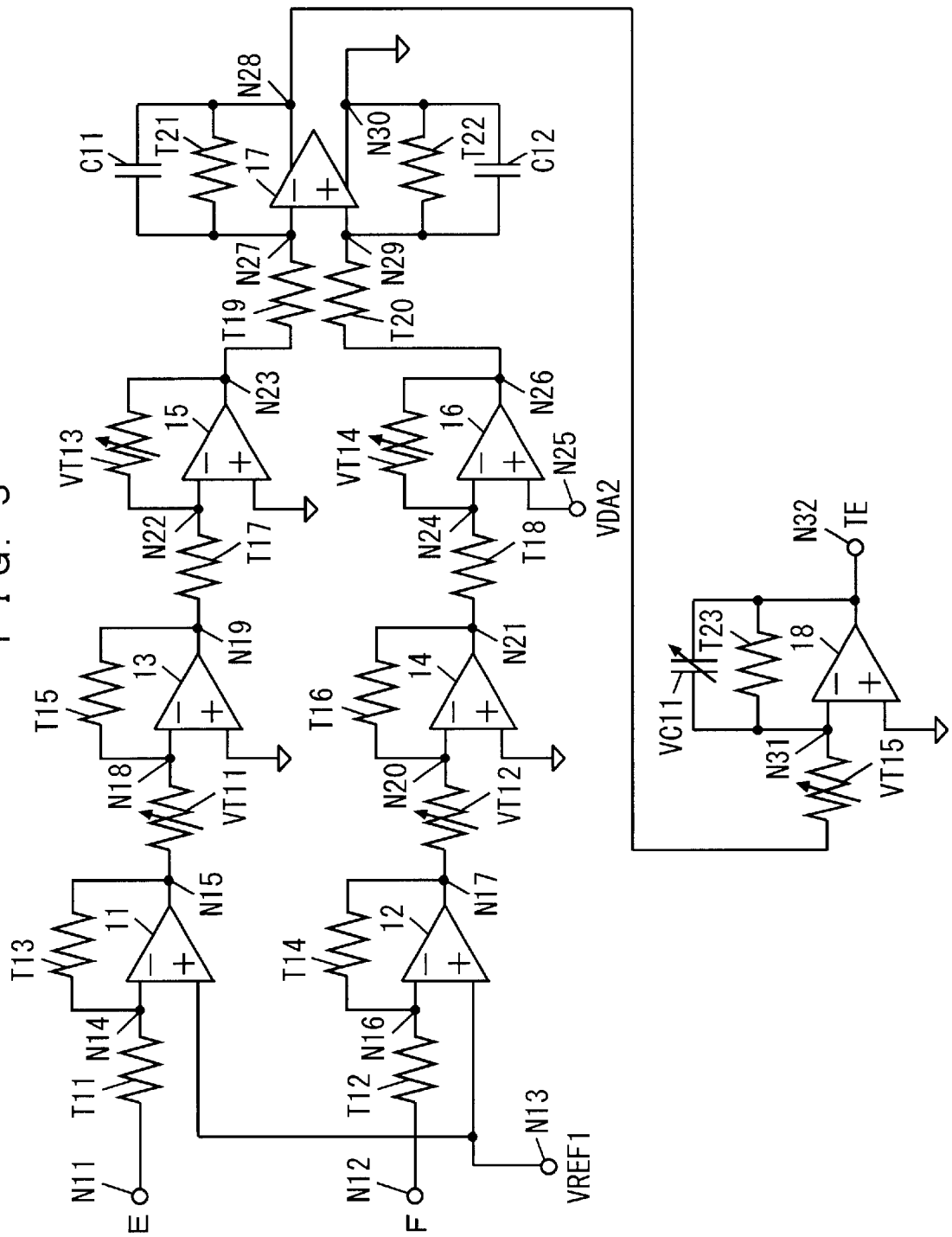
FIG. 5 is a circuit diagram showing the structure of a tracking-system signal processing circuit of an RF amplifier employing the operational amplification circuit shown in FIG. 3.

FIG. 5 is a circuit diagram showing the structure of a tracking-system signal processing part of an RF amplifier employing the operational amplification circuit shown in FIG. 3 .

In the RF amplifier for a CD-ROM drive processing each signal output from an optical pickup employing a photodetection part formed by a quartered photodetection part provided at the center for performing focus servo control employing astigmatism and two photodetection parts provided on both sides of the quartered photodetection part for performing tracking servo control by a three beam method, FIG. 5 shows a part subtracting a tracking signal F of the second tracking servo photodetection part from a tracking signal E from the first tracking servo photodetection part and outputting a tracking error signal TE for performing tracking servo control.

The RF amplifier shown in FIG. 5 includes resistors T11 to T23, operational amplifiers 11 to 18, variable resistance circuits VT11 to VT15, capacitors C11 and C12 and a variable capacitor VC11.

An end of the resistor T11 is connected to a terminal N11, and receives the tracking signal E from the first photodetection part. An inversion input terminal and a non-inversion input terminal of the operational amplifier 11 are connected to the other end of the resistor T11 and a terminal N13 receiving a shift voltage VREF1 respectively, and the resistor T13 is connected between the inversion input terminal and an output terminal. Thus, a level shifting circuit is formed for shifting the tracking signal E input from the terminal T11 from a 5 V-system signal to a 3 V-system signal by the shift voltage VREF1.

The variable resistance circuit VT11 is connected between the output terminal of the operational amplifier 11 and an inversion input terminal of the operational amplifier 13, a non-inversion input terminal of the operational amplifier 13 receives a prescribed reference voltage, and the resistor T15 is connected between the inversion input terminal and an output terminal of the operational amplifier 13. The variable resistance circuit VT11 is formed similarly to the variable resistance circuit VT shown in FIG. 1 with a plurality of resistors, and four types of resistance values can be set for the variable resistance circuit VT11.

Thus, a programmable gain amplifier is so formed that the amplification factor thereof can be set to 0 dB, 6 dB, 14 dB and 20 dB. Therefore, the RF amplifier shown in FIG. 5 is applicable to two types of optical pickups outputting signals of 300 mV and 600 mV by switching the amplification factor to 6 dB, and is also applicable to an optical pickup for a CD-RW drive by switching the amplification factor to 14 dB.

The resistor T17 is connected between the output terminal of the operational amplifier 13 and an inversion input terminal of the operational amplifier 15, a non-inversion input terminal of the operational amplifier 15 receives the prescribed reference voltage, and the variable resistance circuit VT13 is connected between the inversion input terminal and an output terminal of the operational amplifier 15. The variable resistance circuit VT13 is formed similarly to the variable resistance circuit VT shown in FIG. 1, and the resistance value thereof can be switched in 256 stages in response to control signals of eight bits. Thus, a balance circuit is so formed that switching can be made in 256 stages in the rage of 0 dB to 6 dB in response to the control signals of eight bits.

An end of the resistor T12 is connected to the terminal N12, and receives the tracking signal F from the second photodetection part. An inversion input terminal and a non-inversion input terminal of the operational amplifier 12 are connected to the other end of the resistor T12 and the terminal N13 receiving the shift voltage VREF1, and the resistor T14 is connected between the inversion input terminal and an output terminal. Thus, a level shifting circuit is formed for shifting the tracking signal F input from the terminal N12 from a 5 V-system signal to a 3 V-system signal with the shift voltage VREF1.

The variable resistance circuit VT12 is connected between the output terminal of the operational amplifier 12 and an inversion input terminal of the operational amplifier 14, a non-inversion input terminal of the operational amplifier 14 receives the prescribed reference voltage, and the resistor T16 is connected between the inversion input terminal and an output terminal of the operational amplifier 14. The variable resistance circuit VT12 is formed similarly to the variable resistance circuit VT11, and four types of resistance values can be set therefor. Thus, a programmable gain amplifier is so formed that the amplification factor thereof can be set to 0 dB, 6 dB, 14 dB and 20 dB.

The resistor T18 is connected between the output terminal of the operational amplifier 14 and an inversion input terminal of the operational amplifier 16, a non-inversion input terminal of the operational amplifier 16 is connected to a terminal N25 receiving an externally settable reference voltage VDA2, and the variable resistance circuit VT14 is connected between the inversion input terminal and an output terminal of the operational amplifier 16. The variable resistance circuit VT14 is formed similarly to the variable resistance circuit VT13, and the resistance value thereof can be switched in 256 stages in response to control signals of eight bits. Thus, a balance circuit is formed and switching can be made in 256 stages in the range of 0 dB to 6 dB in response to the control signals of eight bits.

The resistor T19 is connected between the output terminal of the operational amplifier 15 and a non-inversion input terminal of the operational amplifier 17, the capacitor C11 and the resistor T21 are connected between an inversion input terminal and a non-inversion output terminal of the operational amplifier 17, the resistor T20 is connected between the output terminal of the operational amplifier 16 and the non-inversion input terminal of the operational amplifier 17, the resistor T22 and the capacitor C12 are connected between the non-inversion input terminal and an inversion output terminal of the operational amplifier 17, and the inversion output terminal of the operational amplifier 17 receives the prescribed reference voltage. Thus, a subtraction circuit is formed and the non-inversion output terminal of the operational amplifier 17 outputs a signal obtained by subtracting the output of the operational amplifier 15 from the output of the operational amplifier 16.

The variable resistance circuit VT15 is connected between the non-inversion output terminal of the operational amplifier 17 and an inversion input terminal of the operational amplifier 18, a non-inversion input terminal of the operational amplifier 18 receives the prescribed reference voltage, and the variable capacitor VC11 and the resistor T23 are connected between the inversion input terminal and an output terminal of the operational amplifier 18.

The variable resistance circuit VT15 is formed similarly to the variable resistance circuit VT shown in FIG. 1 with a plurality of resistors, and the resistance value thereof can be switched in 16 stages with control signals of four bits. The variable capacitor VC11 is so formed that two types of capacitances can be set therefor.

Thus, a programmable gain amplifier is formed and switching can be made in 16 stages in a range of −6 dB to 6 dB in response to the control signals of four bits while two types of frequency characteristics can be set.

Due to the aforementioned structure, the tracking signal E from the first photodetection part is shifted from a 5 V-system signal to a 3 V-system signal with the shift voltage VREF1 by the operational amplifier 11 serving as a level shifting circuit, amplified by the operational amplifier 13 serving as a programmable gain amplifier with the amplification factor of 0 dB, 6 dB, 14 dB or 20 dB and balance-controlled by the operational amplifier 15 serving as a balance circuit at any level of the 256 stages in the range of 0 dB to 6 dB, while the output signal F from the second photodetection part is also processed similarly to the above.

The output signals E and F controlled in level etc. in the aforementioned manner are subjected to subtraction by the operational amplifier 17 serving as a subtraction circuit and finally amplified by the operational amplification circuit 18 with any amplification factor of the 16 stages in the range of −6 dB to 6 dB, for outputting the tracking error signal TE.

A focus-system signal processing part (not shown) is formed similarly to the above, for operating (A+C)−(B+D) with output signals A, B, C and D of the quartered photodetection part and outputting a focus error signal FE.

As hereinabove described, the RF amplifier shown in FIG. 5 employs a number of variable resistance circuits, while the areas of the variable resistance circuits can be reduced and the resistance values thereof can be set in high precision by employing the inventive variable resistance circuit. Therefore, the RF amplifier itself can be reduced in area and improved in precision.

While the above description has been made with reference to the arrangement of the resistors T1 to T8 in the case of employing the variable resistance circuit VT as the resistor forming a negative feedback loop, the resistance value of a resistor connected to an inversion input terminal is preferably maximized also when employing the variable resistance circuit VT as an input resistor, for a reason similar to the above. In each of the variable resistance circuits VT11, VT12 and VT15 shown in FIG. 5, the resistor T8 having the maximum resistance value is connected to the inversion input terminal of the next-stage operational amplifier.

Figure 6:
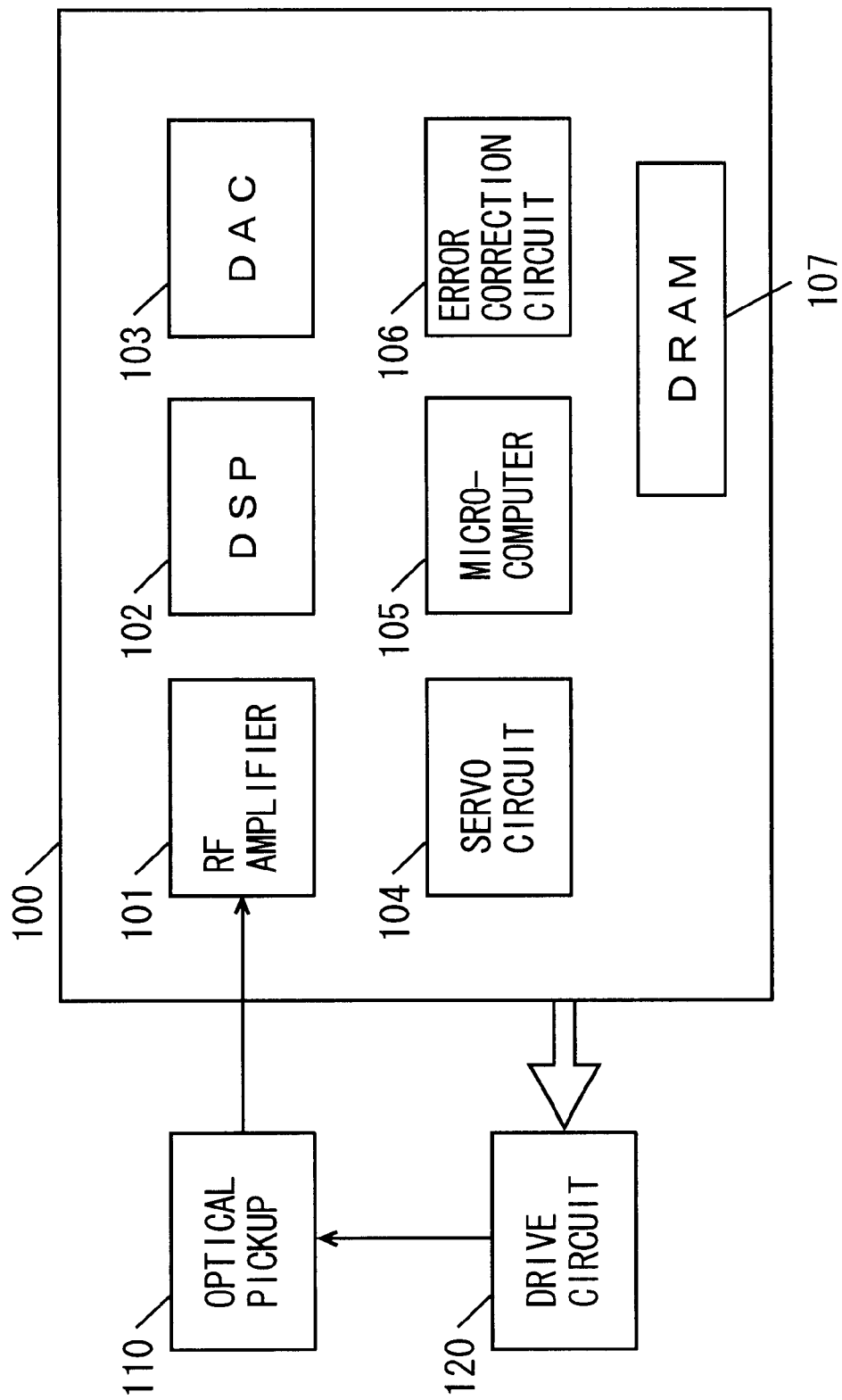
FIG. 6 is a block diagram showing the structure of a semiconductor integrated circuit for a CD-ROM drive including the RF amplifier shown in FIG. 4.

FIG. 6 is a block diagram showing the structure of a semiconductor integrated circuit 100 for a CD-ROM drive, including the RF amplifier shown in FIG. 5.

The semiconductor integrated circuit 100 shown in FIG. 6 includes an RF amplifier 101, a DSP 102, a DAC 103, a servo circuit 104, a microcomputer 105, an error correction circuit 106 and a DRAM 107.

The semiconductor integrated circuit 100 is a CMOS integrated circuit formed by integrating the RF amplifier 101, the DSP 102, the DAC 103, the servo circuit 104, the microcomputer 105, the error correction circuit 106 and the DRAM 107 into a single chip through a CMOS process. In consideration of the cost, the DRAM 107 may alternatively be formed as another chip while integrating the RF amplifier 101, the DSP 102, the DAC 103, the servo circuit 104, the microcomputer 105 and the error correction circuit 106 into a single chip as a CMOS integrated circuit and sealing the chips in the same package.

An optical pickup 110 converts data recorded on a CD-ROM disk to an RF signal and outputs the same to the RF amplifier 101. The RF amplifier 101, formed similarly to the RF amplifier shown in FIG. 4, generates a focus error signal, a tracking signal and a reproduced signal (EFM (eight to fourteen modulation) signal) etc. through the aforementioned processing and outputs these signals to the DSP 102.

The DSP 102 and the servo circuit 104 create a control signal for controlling the optical pickup 110 from the focus error signal and the tracking error signal etc., and output the control signal to a drive circuit 120. The drive circuit 120 drives an actuator provided in the optical pickup 110 in response to the input control signal, for controlling the optical pickup 110 to reproduce an excellent RF signal.

The error correction circuit 106 performs error correction on the reproduced data with the DRAM 107, converts the reproduced data to an analog signal through the DAC 103 and outputs the analog signal when reproducing a sound signal.

The microcomputer 240 serves as a system controller controlling operations of the overall drive, and transmits/receives data etc. to/from the DSP 102 etc. at need, so that the CD-ROM drive executes various operations.

As hereinabove described, the semiconductor integrated circuit 100 shown in FIG. 6 can be integrated into a single chip through the CMOS process along with other blocks by employing the RF amplifier 101 reduced in area and improved in precision, for implementing a miniature one-chip CMOS integrated circuit for a CD-ROM having high performance.

While the above description has been made with reference to the circuit for the CD-ROM drive, the circuit to which the inventive variable resistance circuit etc. are applied is not particularly restricted to this example but the present invention can be similarly applied to various circuits requiring area reduction and high precision, for attaining a similar effect.

(Second Embodiment)

Figure 7:
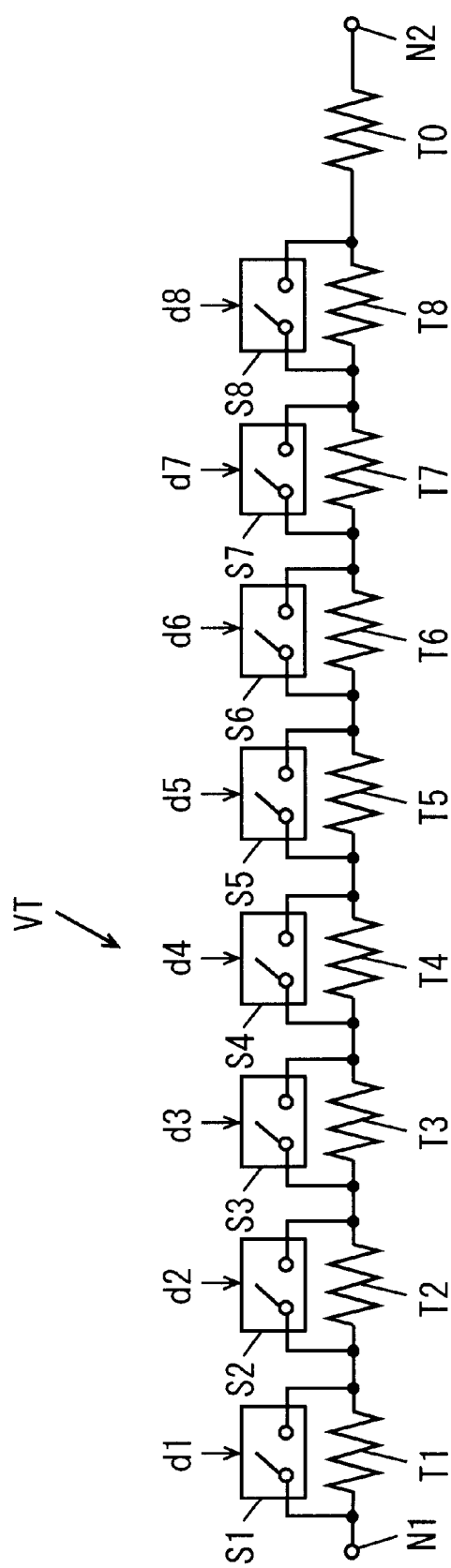
FIG. 7 is a circuit diagram showing the structure of a variable resistance circuit according to a second embodiment of the present invention.

A second embodiment of the present invention is described with reference to FIG. 7. FIG. 7 is a circuit diagram showing the structure of a variable resistance circuit VT according to the second embodiment. The second embodiment is different from the first embodiment only in a point that a resistor T0 is provided in series with a resistor T8 in the variable resistance circuit VT, and the remaining structure of the former is similar to that of the latter. The resistor T0 is a fixed resistor connected with no switch in a parallel manner.

When applying the variable resistance circuit VT according to the second embodiment to the operational amplification circuit shown in FIG. 3, the resistor T0 is located between the resistor T8 and the inversion input terminal of the operational amplifier 1. Thus, the fixed resistor T0 included in the variable resistance circuit VT can freely control the minimum amplitude of a gain.

Further, the resistor T0 is located between the resistor T8 and the inversion input terminal of the operational amplifier 1, whereby the signal of the output terminal N3 of the operational amplifier 1 passes through the resistors T1 to T8 and thereafter passes through the fixed resistor T0 to be fed back to the inversion input terminal of the operational amplifier 1. Thus, it follows that the parasitic capacitances of the switches S1 to S8 are present in front of the fixed resistor T0 and a parasitic capacitance generated in the rear stage of the fixed resistor T0 is extremely reduced, so that deterioration of the frequency characteristic can be prevented.

According to this embodiment, an operational amplification circuit capable of reducing the circuit area and having an excellent frequency characteristic and an integrated circuit employing this operational amplification circuit can be provided.

(Third Embodiment)

Figure 8:
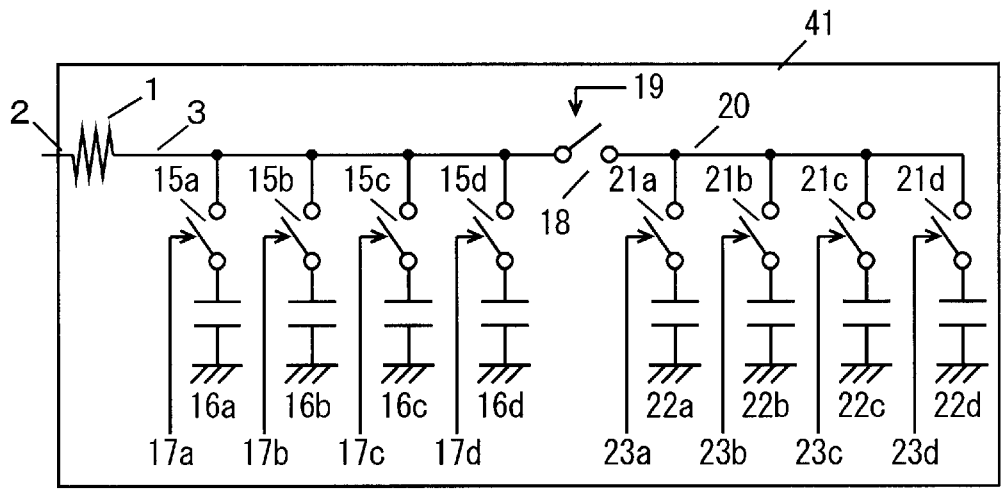
FIG. 8 is a circuit diagram of a time constant switching circuit according to a third embodiment of the present invention.

FIG. 8 shows a time constant switching circuit 47 according to a third embodiment of the present invention. Structures and elements similar to those of the conventional time constant switching circuit are denoted by the same reference numerals, and redundant description is omitted. Referring to FIG. 8, the time constant switching circuit 47 switches eight capacitors for varying a time constant, and first and second terminals of a resistor 1 form an input terminal 2 and an output terminal 3 respectively. Switches 15a to 15d are connected in parallel with the output terminal 3, and grounded capacitors 16a to 16d having different capacitance values are connected to second terminals of the switches 15a to 15d with relation of C(16a)<C(16b)<C(16c)<C(16d) between the capacitance values. The output terminal 3 is serially connected with a switch 18, which is controlled by a control signal 19. Switches 21a to 21d are connected in parallel with a second terminal 20 of the switch 18. Grounded capacitors 22a to 22d having different capacitance values are connected to second terminals of the switches 21a to 21d with relation of C(16d)<C(22a)<C(22b)<C(22c)<C(22d) between the capacitance values. Control signals 23a to 23d on-off control the switches 21a to 21d respectively.

Operations of the time constant switching circuit 47 shown in FIG. 8 are now described. When selecting the capacitor 16a having the minimum capacitance value for implementing the minimum time constant, the switch 15a is turned on while the remaining switches 15b to 15d, 18 and 21a to 21d are turned off. Thus, the decided time constant can be obtained by the resistor 1 and the capacitor 16a. When selecting the capacitor 22a, the switches 18 and 21a are turned on for connecting the capacitor 22a to the output terminal 3.

When connecting any of the capacitors 16a to 16d for implementing a small time constant, the switch 18 is off and hence no influence is exerted by parasitic capacitances of the switches 21a to 21d connected to the terminal 20. Therefore, the number of errors of the time constant can be reduced. When connecting the capacitors 22a to 22d, on the other hand, the switch 18 is on and hence influence is exerted by parasitic capacitances of all switches 15a to 15d, 18 and 21a to 21d, while no problem arises since the time constant is large.

(Fourth Embodiment)

Figure 9:
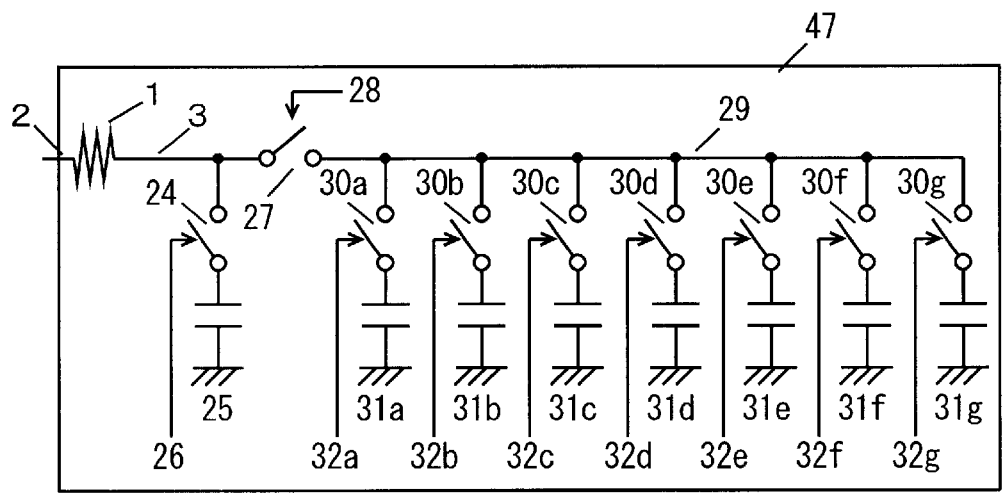
FIG. 9 is a circuit diagram of a time constant switching circuit according to a fourth embodiment of the present invention.

FIG. 9 illustrates a time constant switching circuit 47 according to a fourth embodiment of the present invention. Structures and elements similar to those of the conventional time constant switching circuit are denoted by the same reference numerals, and redundant description is omitted.

Referring to FIG. 9, the time constant switching circuit 47 switches eight capacitors for varying a time constant, and first and second terminals of a resistor 1 form an input terminal 2 and an output terminal 3 respectively. A switch 24 is connected to the output terminal 3, and a grounded capacitor 25 is connected to a second terminal of the switch 24. A control signal 26 on-off controls the switch 24. A switch 27 is connected to the output terminal 3, and on-off controlled by a control signal 28. Switches 30a to 30g are connected in parallel with a second terminal 29 of the switch 27. Grounded capacitors 31a to 31d having different capacitance values are connected to second terminals of the switches 30a to 30d with relation of $C(25)<C(31a)<C(31b)<C(31c)<C(31d)<C(31e)<C(31f)<C(31g)$ between the capacitance values. Control signals 32a to 32g on-off control the switches 30a to 30g respectively.

Operations of the time constant switching circuit 47 shown in FIG. 9 are now described. When selecting the capacitor 25 having the minimum capacitance for implementing the minimum time constant, the switch 24 is turned on while the remaining switches 27 and 30a to 30g are turned off. Thus, the decided time constant can be obtained by the resistor 1 and the capacitor 25. When selecting the capacitor 31a, the switches 27 and 30a are turned on for connecting the capacitor 31a to the output terminal 3.

When connecting the capacitor 24 for implementing the minimum time constant, the switch 27 is off and hence no influence is exerted by parasitic capacitances of the switches 30a to 30g connected to the terminal 29. Therefore, the number of errors of the time constant can be reduced when obtaining the minimum time constant conceivably most influenced by the parasitic capacitances. When connecting the capacitors 30a to 30d, on the other hand, the switch 27 is on and hence influence is exerted by parasitic capacitances of all switches 24, 27 and 30a to 30g, while no problem arises since the time constant is large.

Figure 10:
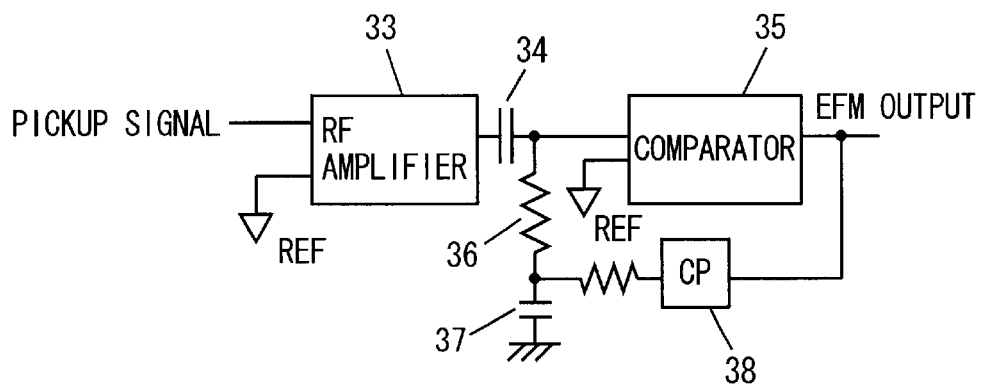
FIG. 10 is a circuit structural diagram of an RF signal processing part for a CD-ROM.

FIG. 10 is a circuit diagram showing the structure of an RF-system signal processing part of an RF (radio frequency) amplifier 33 for a CD-ROM (compact disk read only memory) including the inventive time constant switching circuit.

A signal recorded in an optical disk such as a CD-ROM is reproduced by converting an analog RF (radio frequency) signal read from the optical disk to a binary RF signal, i.e., a digital RF signal with reference to a prescribed slice level. The signal recorded in the optical disk is generally an EFM (eight to fourteen modulation) signal, which is so set that a dc component of the signal is basically zero. Therefore, the aforementioned slice level in the digitalization is controlled to the center voltage level of the input analog RF signal.

The circuit shown in FIG. 10 is formed by a digitalization part converting an analog RF signal to a digital RF signal and a slice level control part.

The RF amplifier 33 performs high-frequency (RF) amplification and waveform shaping on a signal read from the optical disk by a pickup and supplies the obtained analog RF signal to an inversion input terminal of a comparator 35 through an input capacitor 34 for removing a dc component. The comparator 35, which is the digitalization part supplied with a constant reference voltage Vref in a non-inversion input terminal thereof, compares the aforementioned analog RF signal with the reference voltage Vref, converts the analog signal to a digital RF signal and outputs the digital RF signal.

An end of a resistor 36 is connected between the input capacitor 34 and the inversion input terminal of the comparator 35, while a positive electrode of an integrating capacitor 37 for shifting the center voltage level of the input analog RF signal by charging/discharging is connected to another end of the resistor 36.

A charge pumping circuit 38 is provided between the output side of the comparator 35 and the positive electrode of the integrating capacitor 37. The charge pumping circuit 38 controls charging/discharging of the integrating capacitor 37 in response to the output level of the digital RF signal output from the comparator 35, whereby the quantity of charging/discharging of the integrating capacitor 37 is controlled in response to an average dc level of the output digital RF signal.

The integrating capacitor 37 integrates the output of the comparator 35 through the charge pumping circuit 38 and operates an average value of the digital RF signal. This average value is added to the analog RF signal through the resistor 36. Therefore, the center voltage level of the analog RF signal is adjusted in response to the voltage level of the positive electrode of the integrating capacitor 37, i.e., the average dc level of the digital RF signal, and the slice level is controlled following the center voltage level of the analog RF signal.

Figure 11:
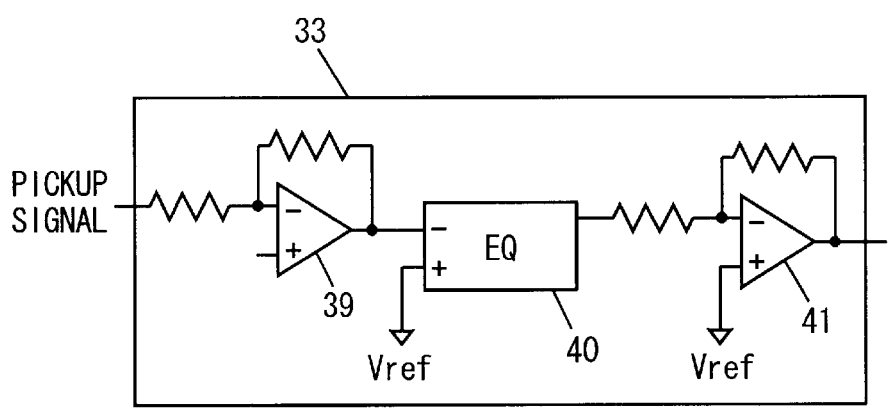
FIG. 11 is a circuit structural diagram of an RF amplifier.

FIG. 11 shows the circuit structure of the RF amplifier 33 shown in FIG. 10 in detail. The RF amplifier 33, formed by successively directly connecting a first operational amplification circuit 39, a waveform shaping circuit 40 and a second operational amplification circuit 41, performs amplification and waveform shaping on the analog RF signal and outputs the signal to the next-stage comparator 35. The waveform shaping circuit 40 is used for correcting reduction of the amplitude resulting from deterioration of a laser of a pickup part. The amplitude tends to be reduced as the length of bits formed on the CD-ROM is reduced, i.e., as the frequency of the analog RF signal is increased, and a digital RF signal component such as a jitter is disadvantageously deteriorated since the comparator 35 binarizes analog RF signals having different amplitudes. Therefore, the waveform shaping circuit 40 amplifies only a signal having a high frequency for uniforming the amplitudes of analog RF signals over all frequency regions.

Figure 12:
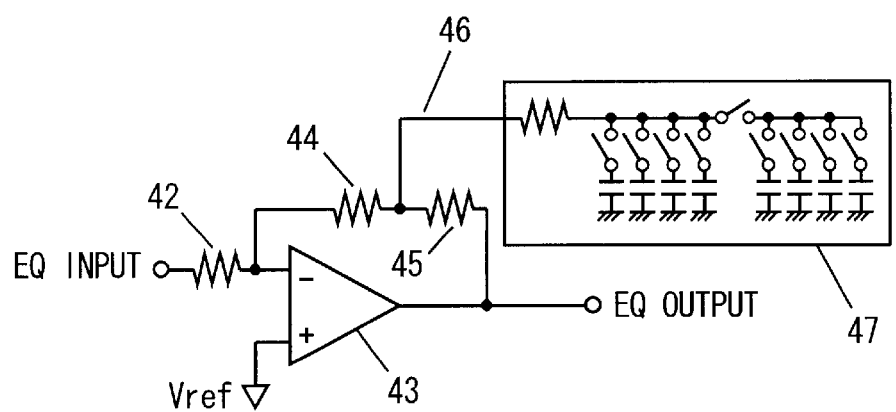
FIG. 12 is a circuit diagram of a waveform shaping circuit.

FIG. 12 is a detailed circuit structural diagram of the waveform shaping circuit 40. A terminal of a resistor 42 is used as an EQ input, and another terminal is connected with an inversion input terminal of a differential amplifier 43. Serially connected resistors 44 and 45 are inserted between the inversion input terminal and an output terminal of the differential amplifier 43, and the output terminal of the differential amplifier 43 forms an EQ output. The time constant switching circuit 47 shown in FIG. 8 is arranged on a node 46 between the resistors 44 and 45. The waveform shaping circuit 40 having the aforementioned structure can implement a plurality of frequency characteristics by switching the time constant by the time constant switching circuit 47, as shown in FIG. 13.

Figure 13:
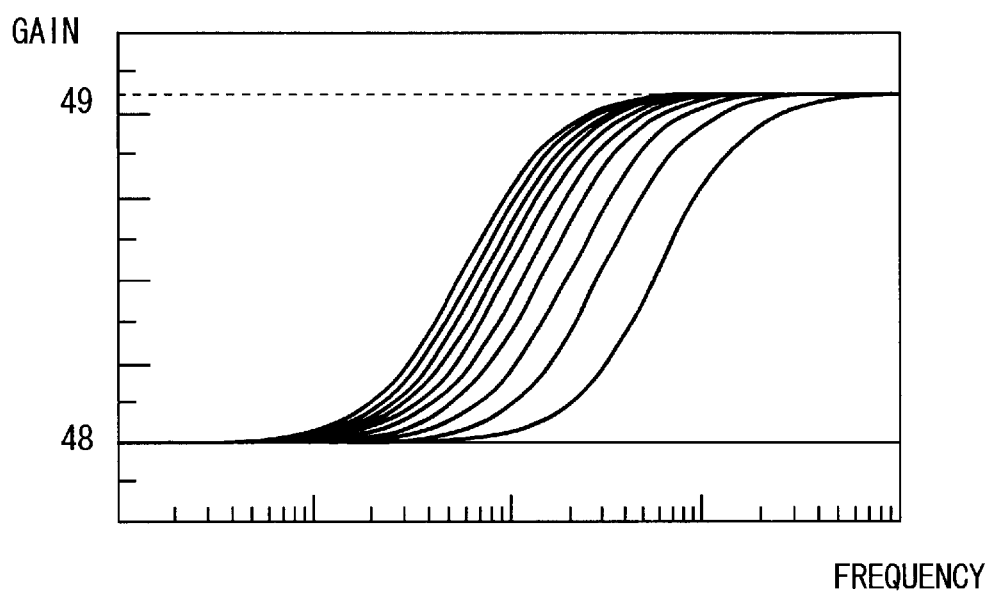
FIG. 13 illustrates results of simulation (frequency-gain characteristics) of the waveform shaping circuit.
Figure 14:
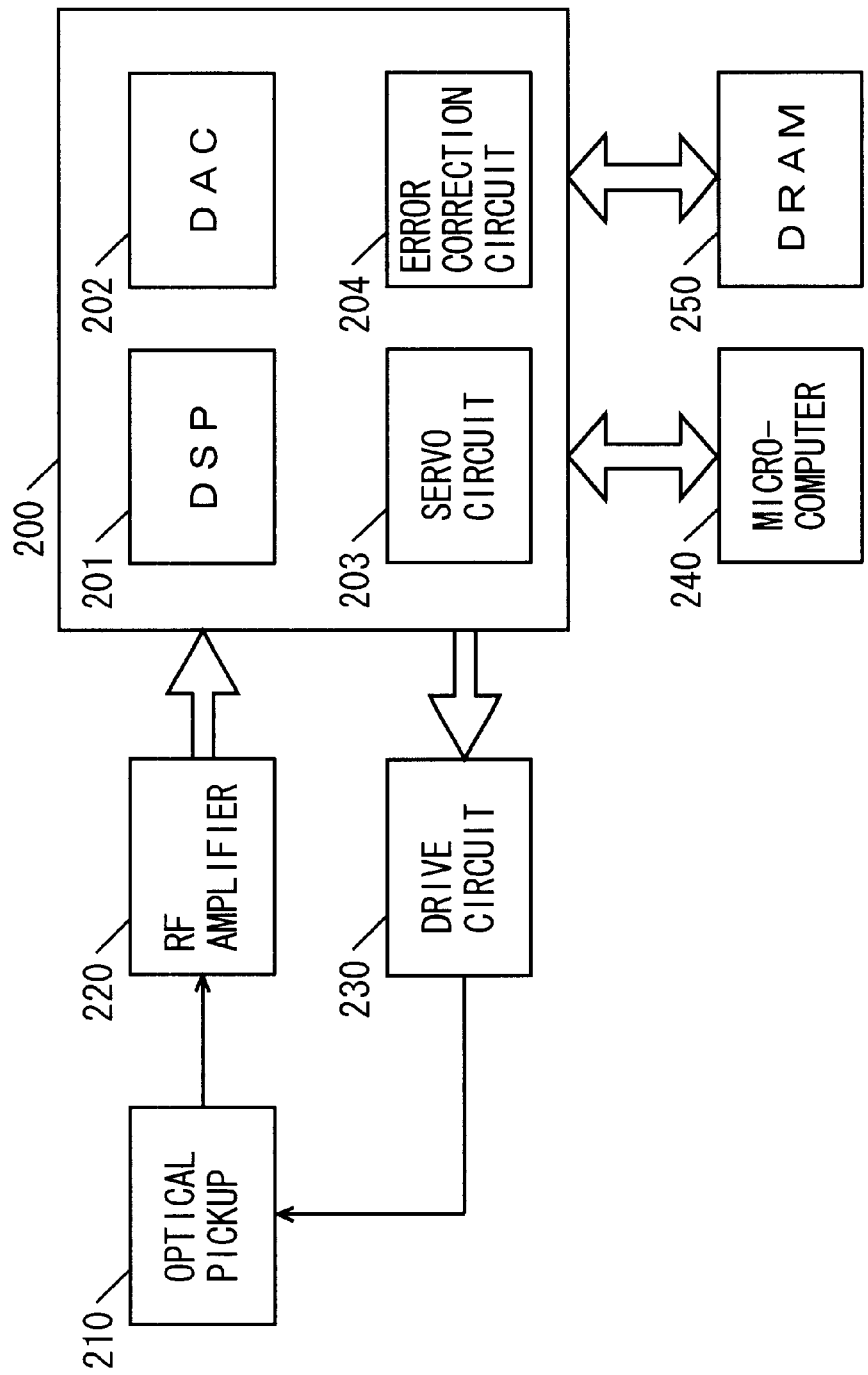
FIG. 14 is a block diagram showing the structure of a conventional semiconductor integrated circuit applied to a CD-ROM drive.
Figure 15:
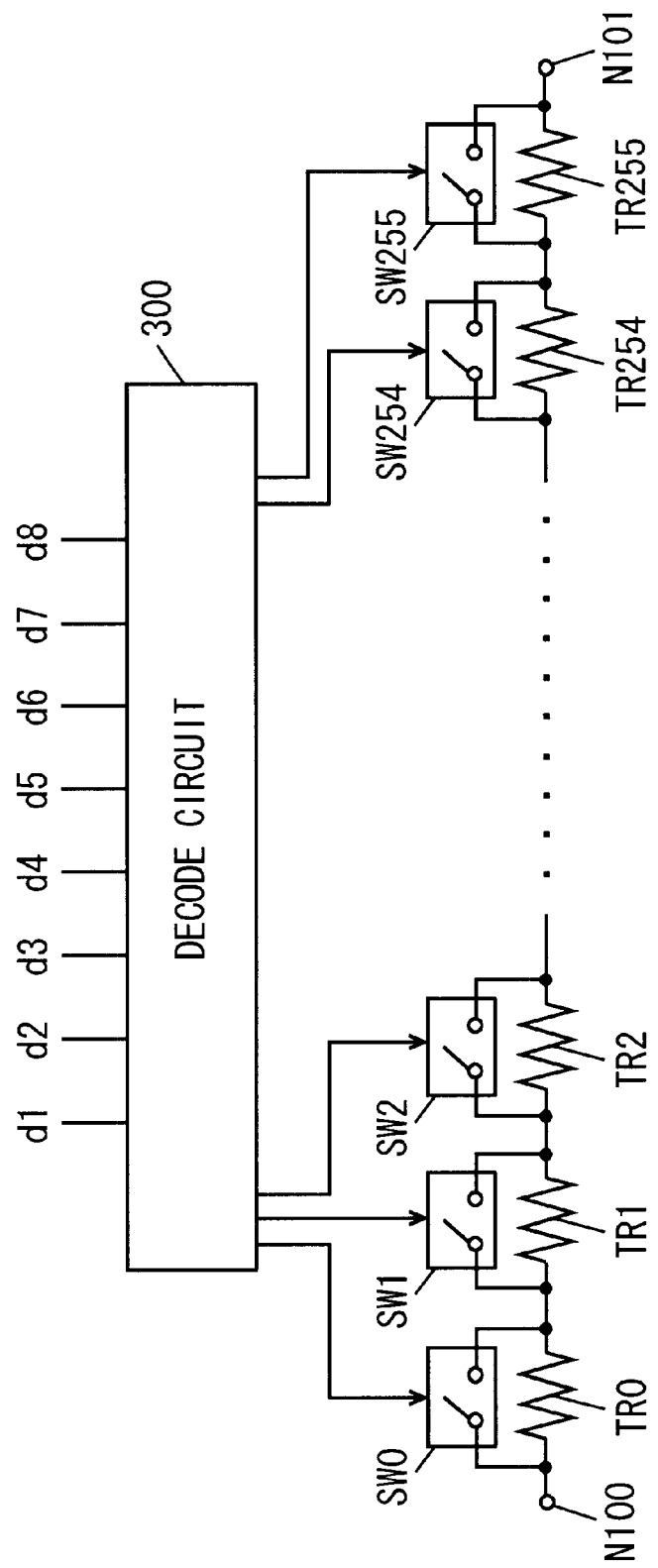
FIG. 15 is a circuit diagram showing the structure of a conventional variable resistance circuit.
Figure 16:
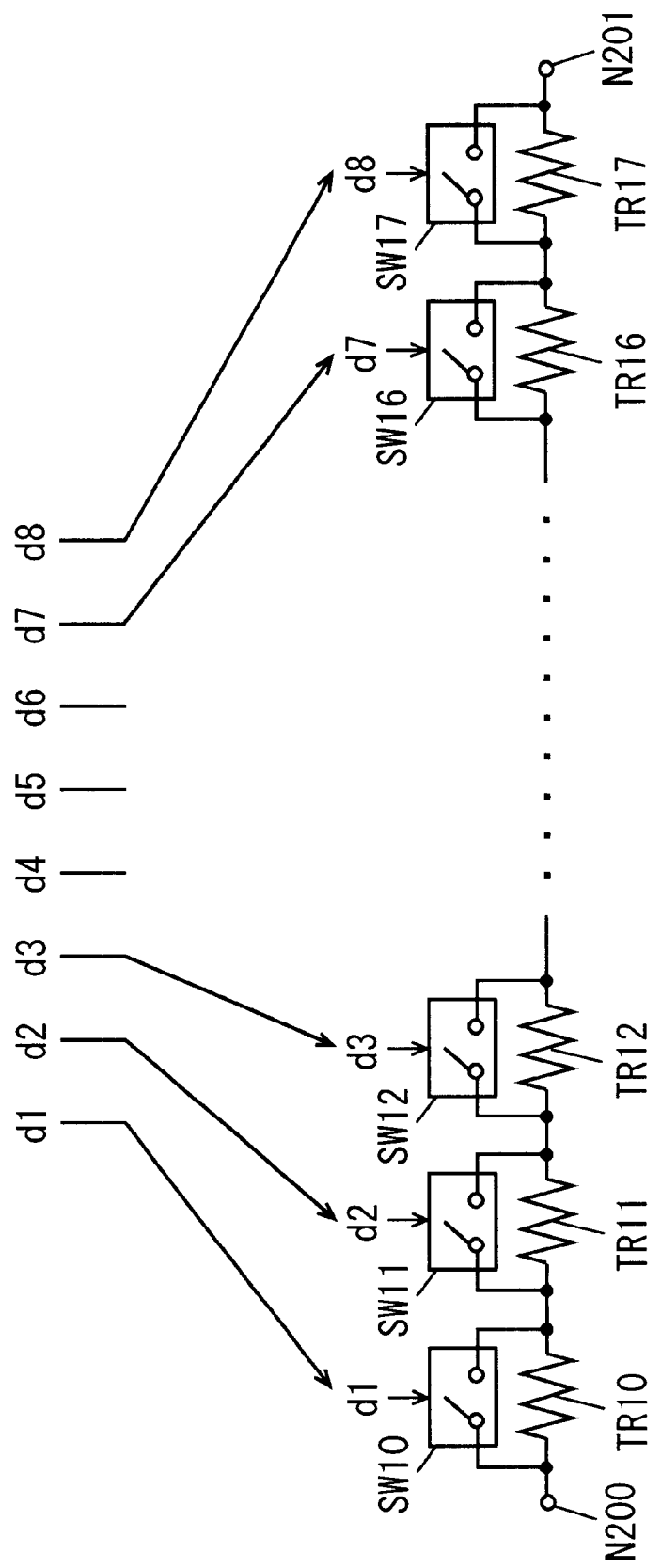
FIG. 16 is a circuit diagram showing the structure of another conventional variable resistance circuit.
Figure 17:
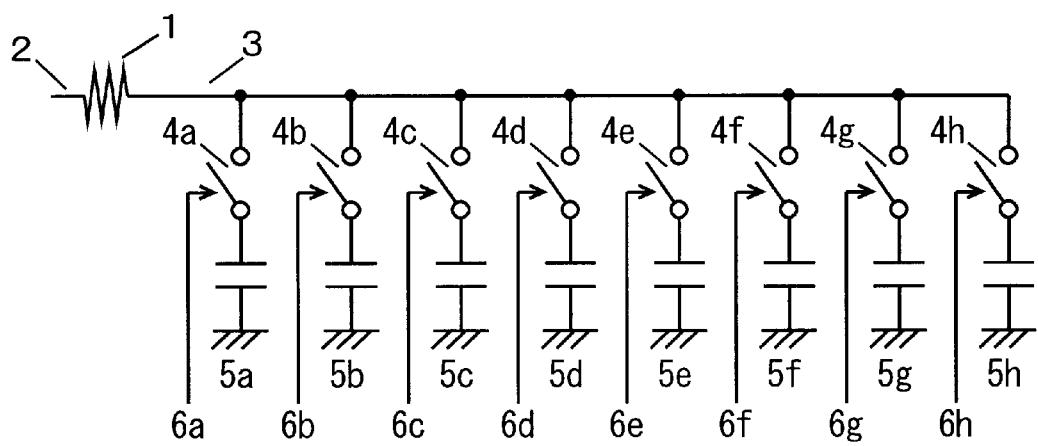
FIG. 17 is a circuit diagram of a conventional time constant switching circuit.
Figure 18:
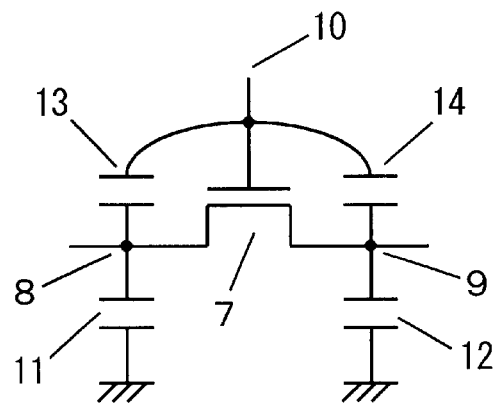
FIG. 18 is a circuit diagram of a MOS switch.

FIG. 13 shows results of simulation of frequency-gain characteristics of the waveform shaping circuit 40 shown in FIG. 12. A low-frequency gain 48 is decided by the resistance values of the resistors 42, 43 and 44, and a high-frequency gain 49 is decided by the resistance values of the resistors 42 to 45. FIG. 13 shows ten types of frequency-gain characteristics having different frequencies (boost frequencies) starting amplification. This is because the RF amplifier 33 for a CD-ROM must handle RF analog signals having different frequency components such as an equal-speed component and a quadruple-speed component and switch the frequency characteristic of the waveform shaping circuit 40 in response to each speed component. The boost frequency is decided by the resistor 45 and the capacitance value of a capacitor selected by a capacitance switching part 47 and connected to the node 46. Therefore, a parasitic capacitance of a switch of the capacitance switching part 47 can be reduced by applying the inventive time constant switching circuit to the capacitance switching part 47, whereby a waveform shaping circuit having an excellent high-frequency characteristic can be implemented.

As described above, an RF amplifier for a CD-ROM having excellent frequency characteristics can be implemented by employing the inventive time constant switching circuit for switching the boost frequency of the waveform shaping circuit.

While the above description has been made with reference to the RF amplifier 33 for a CD-ROM, the inventive time constant switching circuit is not restricted to this but similarly applicable to various circuits requiring excellent frequency characteristics, for attaining similar effects.

As described above in detail, the inventive time constant switching circuit can suppress influence by parasitic capacitances of switches when implementing a small time constant. Therefore, the number of errors of the time constant can be reduced for implementing excellent frequency characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable resistance circuit comprising:
   serially connected N resistors, said N being integer of at least 2; and
   N switches connected in parallel with said N resistors respectively and selectively turned on or off, wherein
   the resistance value of at least one of said resistors is different from the resistance value of another resistor, and
   the resistance value of a parasitic resistance of each of said N switches in an ON state is in proportion to or in positive correlation similar to proportion to the resistance value of the resistor connected in parallel with said switch.

2. The variable resistance circuit according to claim 1, wherein
   each of said N switches includes a transistor connected in parallel with the resistor, and
   the resistance value of the resister is in inverse proportion to or in negative correlation similar to inverse proportion to the gate width of said transistor connected in parallel with said resister.

3. The variable resistance circuit according to claim 1, wherein
   each resistance value of said N resistors is set to $R \times 2^i$ ($\Omega$) (i: integer of 0 to (N−1)), and the resistance value of each parasitic resistance of said N switches is set to $r \times 2^i$ ($\Omega$).

4. The variable resistance circuit according to claim 1, wherein
   said switches are formed by CMOS switches.

5. An operational amplification circuit comprising:
   a variable resistance circuit; and
   an operational amplifier, connected with said variable resistance circuit, having an amplification factor varying with the resistance value of said variable resistance circuit, wherein
   said variable resistance circuit includes:
   serially connected N resistors, said N being integer of at least 2, and
   N switches connected in parallel with said N resistors respectively and selectively turned on or off,
   the resistance value of at least one of said resistors is different from the resistance value of another resistor, and
   the resistance value of a parasitic resistance of each of said N switches in an ON state is in proportion to or in positive correlation similar to proportion to the resistance value of the resistor connected in parallel with said switch.

6. The operational amplification circuit according to claim 5, wherein
   said variable resistance circuit is connected to an input terminal of said operational amplifier, and the resistor having the maximum resistance value is connected to said input terminal among said N resistors.

7. A semiconductor integrated circuit receiving an output signal from an optical pickup, comprising:
   an operational amplification circuit amplifying said output signal from said optical pickup; and
   another circuit, wherein
   said operational amplification circuit and said another circuit are integrated into a single chip by a CMOS integrated circuit,
   said operational amplification circuit includes:
   a variable resistance circuit, and
   an operational amplifier, connected with said variable resistance circuit, having an amplification factor varying with the resistance value of said variable resistance circuit,
   said variable resistance circuit includes:
   serially connected N resistors, said N being integer of at least 2, and
   N switches connected in parallel with said N resistors respectively and selectively turned on or off,
   the resistance value of at least one of said resistors is different from the resistance value of another resistor, and
   the resistance value of a parasitic resistance of each of said N switches in an ON state is in proportion to or in positive correlation similar to proportion to the resistance value of the resistor connected in parallel with said switch.

8. An operational amplification circuit comprising:

an operational amplifier; and a variable resistance circuit connected to an input terminal of said operational amplifier, wherein said variable resistance circuit includes:

serially connected N resistors, said N being integer of at least 2, and

N switches connected in parallel with said N resistors respectively and selectively turned on or off, the resistance value of at least one of said resistors is different from the resistance value of another resistor, and the resistor having the maximum resistance value is connected to said input terminal among said N resistors.

9. The operational amplification circuit according to claim 8, wherein said N resistors are arranged in order of the resistance values.

10. The operational amplification circuit according to claim 8, wherein each resistance value of said N resistors is set to $R \times 2^i$ ($\Omega$) (i: integer of 0 to (N−1)).

11. The operational amplification circuit according to claim 8, wherein said variable resistance circuit includes a fixed resistor arranged between said resistor having the maximum resistance value and said input terminal.

12. The operational amplification circuit according to claim 8, wherein said switches are formed by CMOS switches.

13. The operational amplification circuit according to claim 8, wherein said variable resistance circuit is used as a resistance circuit forming a feedback loop of said operational amplifier, and the amplification factor of said operational amplifier varies with the resistance value of said variable resistance circuit.

14. The operational amplification circuit according to claim 8, further comprising a resistance circuit, forming a feedback loop of said operational amplifier, including a fixed resistor, wherein an input signal is input in said operational amplifier through said variable resistance circuit, and said operational amplifier, said variable resistance circuit and said resistance circuit constitute a programmable gain amplifier.

15. A semiconductor integrated circuit receiving an output signal from an optical pickup, comprising:

an operational amplification circuit amplifying said output signal from said optical pickup; and another circuit, wherein said operational amplification circuit and said another circuit are integrated into a single chip by a CMOS integrated circuit, said operational amplification circuit includes:

an operational amplifier, and a variable resistance circuit connected to an input terminal of said operational amplifier, said variable resistance circuit includes:

serially connected N resistors, said N being integer of at least 2, and

N switches connected in parallel with said N resistors respectively and selectively turned on or off, the resistance value of at least one of said resistors is different from the resistance value of another resistor, and the resistor having the maximum resistance value is arranged on the side of said input terminal among said N resistors.

* * * * *